United States Patent
Takahashi et al.

[11] Patent Number: 5,333,505
[45] Date of Patent: Aug. 2, 1994

[54] SEMICONDUCTOR PRESSURE SENSOR FOR USE AT HIGH TEMPERATURE AND PRESSURE AND METHOD OF MANUFACTURING SAME

[75] Inventors: Yoshiharu Takahashi; Tetsuya Hirose; Hiroshi Otani; Seiji Takemura, all of Itami, Japan

[73] Assignee: Mitsubishi Denki Kabushiki Kaisha, Tokyo, Japan

[21] Appl. No.: 3,437

[22] Filed: Jan. 12, 1993

[30] Foreign Application Priority Data

Jan. 13, 1992 [JP] Japan .................... 4-003730
Feb. 19, 1992 [JP] Japan .................... 4-032008
Aug. 25, 1992 [JP] Japan .................... 4-225942

[51] Int. Cl.$^5$ ................ G01L 9/06; G01L 9/08
[52] U.S. Cl. .................... 73/727; 29/621.1; 338/4
[58] Field of Search .......... 29/621.1; 338/3, 4; 73/708, 706, 720, 721, 726, 727, 756

[56] References Cited

U.S. PATENT DOCUMENTS

| | | | |
|---|---|---|---|
| 4,823,605 | 4/1989 | Stein | 29/621.1 X |
| 5,207,102 | 5/1993 | Takahashi et al. | 29/621.1 X |
| 5,209,120 | 5/1993 | Araki | 29/621.1 X |

FOREIGN PATENT DOCUMENTS

| | | |
|---|---|---|
| 62-144368 | 6/1987 | Japan . |
| 675537 | 3/1988 | Japan ................. 73/720 |

*Primary Examiner*—Richard E. Chilcot, Jr.
*Assistant Examiner*—Joseph L. Felber
*Attorney, Agent, or Firm*—Oblon, Spivak, McClelland, Maier & Neustadt

[57] ABSTRACT

In a semiconductor pressure sensor, a dam which prevents a sheathing resin from flowing into a diaphragm portion during the molding of the sheathing resin is disposed on the outer periphery of piezoresistors and the diaphragm portion on the surface of a semiconductor pressure sensor chip. The volume of the base and that of the semiconductor pressure sensor chip are adjusted so that a tensile force exerted upon the semiconductor pressure sensor chip by the base cancels a compressive force exerted upon the semiconductor pressure sensor by the sheathing resin when the temperature of the semiconductor pressure sensor returns to an ordinary room temperature from a high temperature. As a result, strain is not caused in the semiconductor pressure sensor chip, and therefore measurements of pressure with a high degree of accuracy can be performed.

19 Claims, 23 Drawing Sheets

SEMICONDUCTOR PRESSURE SENSOR FOR USE AT HIGH TEMPERATURE AND PRESSURE AND METHOD OF MANUFACTURING SAME

BACKGROUND OF THE INVENTION

Field of the Invention

The present invention relates to a semiconductor pressure sensor and a method of manufacturing the same. More particularly, the present invention relates to a semiconductor pressure sensor for use at a high temperature and pressure, in which the internal wiring thereof is monolithically sheathed in order to prevent the internal wiring from being broken by vibrations and other forces transmitted from outside and to a method of manufacturing the same.

Description of the Related Art

Semiconductor pressure sensors directly receive the pressure of gas or liquid to be measured by a diaphragm, for example, a silicon diaphragm, and sense the deformation of the silicon diaphragm due to the pressure resulting from the change in the resistance value of a piezoresistor formed on the silicon diaphragm. Therefore, when pressure is not applied to a diaphragm portion, it is required that the piezoresistor not be deformed.

FIG. 39 is a longitudinal cross-sectional view which illustrates a conventional semiconductor pressure sensor. Like reference numerals indicate like or identical parts throughout the figures. In FIG. 39, a piezoresistor 2 is formed on the surface of a semiconductor pressure sensor chip 1. The semiconductor pressure sensor chip 1 is bonded to a base 4 by a first die bonding material 3. The base 4 is bonded to a stem 6 by a second die bonding material 5. A lead 7 for internal connection, connected to the semiconductor pressure sensor chip 1, is connected by an insulating resin 8 to a lead (post) for external connection which is connected to a through hole 6a of the stem 6. A cap 10 for protecting the semiconductor pressure sensor chip 1 and the lead 7 for internal connection is provided on the outer periphery of the semiconductor pressure sensor.

In the conventional semiconductor pressure sensor constructed as described above, the semiconductor pressure sensor chip 1 is bonded to the base 4 by the first die bonding material 3, and the base 4 is bonded to the stem 6 by the second die bonding material 5, as also previously mentioned. Therefore, the piezoresistor 2 provided on the surface of the semiconductor pressure sensor chip 1 is directly subjected to a thermal stress caused by a difference between the linear expansion coefficient of the first die bonding material 3 and that of the semiconductor pressure sensor chip 1.

Since the piezoresistor 2 is formed as one piece with elements made of different materials, such as the base 4, the second die bonding material 5 or the stem 6, the piezoresistor 2 is subjected to thermal stress caused by a difference between the linear expansion coefficients thereof.

Furthermore, since the cap 10 is bonded to the stem 6, thermal stress is also exerted upon the piezoresistor 2 from the stem 6, the second die bonding material 5, the base 4 and the first die bonding material 3. Also, when a lead 9 for external connection is connected to an outside power supply or external detection system (not shown), if an external force is received from this lead 9, the external force is transmitted from the insulating resin 8 via the stem 6, the second die bonding material 5, the base 4 and the first die bonding material 3 to the semiconductor pressure sensor chip 1, causing the piezoresistor 2 to be strained.

In the conventional semiconductor pressure sensor, an external force is transmitted as described above. Therefore, strain in the base 4 which is caused when bonding is performed by using the same material as the semiconductor pressure sensor chip 1 because they have different linear expansion coefficients, must be minimized. As a result, a groove 5a must be provided in the second die bonding material 5 to reduce strain transmitted to the semiconductor pressure sensor chip 1 via the stem 6 and the second die bonding material 5. In the first die bonding material 3 and the second die bonding material 5, gold silicon foils are used to satisfactorily secure air tightness, and operations at a high temperature must be performed.

In addition, since the lead 7 for internal connection is formed by a both-end fixed beam to reduce strain transmitted from outside, there is a problem in that the line diameter and length are limited when these are designed to make the lead 7 for internal connection have sufficient rigidity to withstand vibrations.

As set forth above, in the conventional method, strain is transmitted from only the bottom surface of the semiconductor pressure sensor chip 1, i.e., the surface by which the chip 1 is bonded to the base 4. As a consequence, only those methods employing materials having a linear expansion coefficient, particularly materials having such a coefficient close to that of the semiconductor pressure sensor chip 1, and methods in which the dimensions and shape of the base 4 are optimized, are used.

FIG. 40 is a longitudinal cross-sectional view which illustrates another conventional semiconductor pressure sensor disclosed in, for example, Japanese Patent Laid-Open No. 62-144368. In this figure, a polyamide film 14 having a low thermal expansion, within which a silicon oxide ($SiO_2$) film 13 is formed, is placed on a silicon diaphragm 11. The silicon diaphragm 11 is mounted on a pyrex glass 15. The pyrex glass 15 is mounted on a package 16. A metallic wire 17 and the lead 9 for external connection are fixed together by a gelatinous silicone film 18.

In the above-described semiconductor pressure sensor, however, it is difficult to coat the gelatinous silicone film 18 with a high degree of accuracy, and it is difficult to prevent the film 18 from flowing out to a diaphragm portion. The elastic coefficient of a gelatinous silicone film with respect to an external force transmitted from outside is smaller by four to five orders than that of a mold compound material. Also, the gelatinous silicone film is easily deformed by vibrations and by merely touching it from outside. Thus, it has a drawback in that its effectiveness as a means for protecting the metallic wire 17 is limited.

A gelatinous silicone film 18 having a low elastic coefficient is selected as a material to sheath the silicon diaphragm portion to reduce strain and stress. However, the strength of the resin is insufficient, and a problem arises in that the metallic wire 17 and the silicon diaphragm 11 cannot be protected satisfactorily.

FIG. 41 is a longitudinal cross-sectional view which illustrates another conventional semiconductor pressure sensor. In the semiconductor pressure sensor of this figure, the semiconductor pressure sensor chip 1 and the lead 7 for internal connection or the like, except the pressure detecting section, are covered with the sheathing resin 22 on the stem 6.

However, this sensor has a problem in that the bonding of the stem 6 with the sheathing resin 22 is inadequate and water enters the inside thereof, decreasing the reliability of the connection of the lead 7 for internal connection and the bonding portion thereof, or increasing the internal stress, making it impossible to perform accurate pressure measurements.

The conventional semiconductor pressure sensor has problems described below. The base 4 having a line expansion coefficient closer to that of the semiconductor pressure sensor chip 1 must be selected in order to decrease strain transmitted from the base 4. It is difficult to apply the gelatinous silicone film 18 with a high degree of accuracy, and the bonding strength is inadequate, making it impossible to satisfactorily protect the internal wiring. Furthermore, the bonding of the stem 6 with the sheathing resin 22 is inadequate and water enters the inside thereof, decreasing the reliability of the connection of the internal connection lead 7 and the bonding portion thereof, or increasing the internal stress, making it impossible to perform accurate pressure measurements.

SUMMARY OF THE INVENTION

The present invention has been accomplished to solve the above-mentioned problems of the prior art.

An object of the present invention is to obtain a semiconductor pressure sensor whose strength to withstand vibrations transmitted from outside is increased considerably by molding semiconductor pressure sensor chips or the like while preventing a sheathing resin from flowing in and by fixing leads for internal connection by an ordinary sheathing resin having a large elastic coefficient.

Another object of the present invention is to obtain a semiconductor pressure sensor in which semiconductor pressure sensor chips are not strained by balancing a tensile force which the chips receive from a base with a compressive force which the chips receive from a sheathing resin.

A further object of the present invention is to obtain a semiconductor pressure sensor having high reliability by securely bonding the stem with the sheathing resin.

Still a further object of the present invention is to obtain a method of manufacturing semiconductor pressure sensors, in which a sheathing resin can be molded with a high degree of accuracy by preventing the sheathing resin from flowing into a diaphragm portion.

In order to achieve the above objects, according to one aspect of the present invention, there is provided a semiconductor pressure sensor chip on the obverse surface of which piezoresistors are provided and on the reverse surface of which a diaphragm portion is formed; a base on which the semiconductor pressure sensor chip is placed; a stem on which the base is placed; and a sheathing resin which covers an area near the side of the semiconductor pressure sensor chip and the side of the base and which is molded on the stem; and a dam which prevents the sheathing resin from flowing into the diaphragm portion during the molding of the sheathing resin is disposed on the outer periphery of the piezoresistor and the diaphragm portion on the surface of the semiconductor pressure sensor chip.

According to another aspect of the present invention, there is provided a semiconductor pressure sensor comprising: a semiconductor pressure sensor chip on the obverse surface of which piezoresistors are provided and on the reverse surface of which a diaphragm portion is formed; a base on which the semiconductor pressure sensor chip is placed; a stem on which the base is placed; and a sheathing resin which covers an area near the side of the semiconductor pressure sensor chip and the side of the base and which is molded on the stem, wherein the semiconductor pressure sensor chip, the base and the sheathing resin are each formed from a material which satisfies $\alpha_2 > \alpha_0 > \alpha_1$ when their thermal expansion coefficients are denoted as $\alpha_0$, $\alpha_1$ and $\alpha_2$, respectively, and the volume of the base and that of the semiconductor pressure sensor chip are adjusted so that a tensile force exerted upon the semiconductor pressure sensor chip from the base cancels a compressive force exerted upon the semiconductor pressure sensor chip by the sheathing resin when the temperature of the semiconductor pressure sensor returns to an ordinary room temperature from a high temperature.

According to still another aspect of the present invention, there is provided a semiconductor pressure sensor comprising: a semiconductor pressure sensor chip, on the obverse surface of which a piezoresistor is provided and on the reverse surface of which a diaphragm portion is formed; a base on which the semiconductor pressure sensor chip is placed; a stem on which the base is placed; a sheathing resin which is molded on the stem in such a manner as to cover the proximity of the side of the semiconductor pressure sensor chip and the side of the base; and bonding-area enlarging means provided on the area where the stem is bonded with the sheathing resin.

According to still another aspect of the present invention, there is provided a method of manufacturing semiconductor pressure sensors comprising the steps of: providing a dam on the outer periphery of piezoresistors and a diaphragm portion on the surface of a semiconductor pressure sensor chip; bonding together the base, the semiconductor pressure sensor chip and a stem; electrically connecting the electrodes of the semiconductor pressure sensor chip to leads for external connection provided in the stem; and molding the outside of the dam by using a sheathing resin so as to cover an area near the side of the semiconductor pressure sensor chip, the side of the base and a projection portion of the leads on the side of the semiconductor pressure sensor chip for external connection.

DESCRIPTION OF THE PREFERRED EMBODIMENTS

First Embodiment

Figure 1:
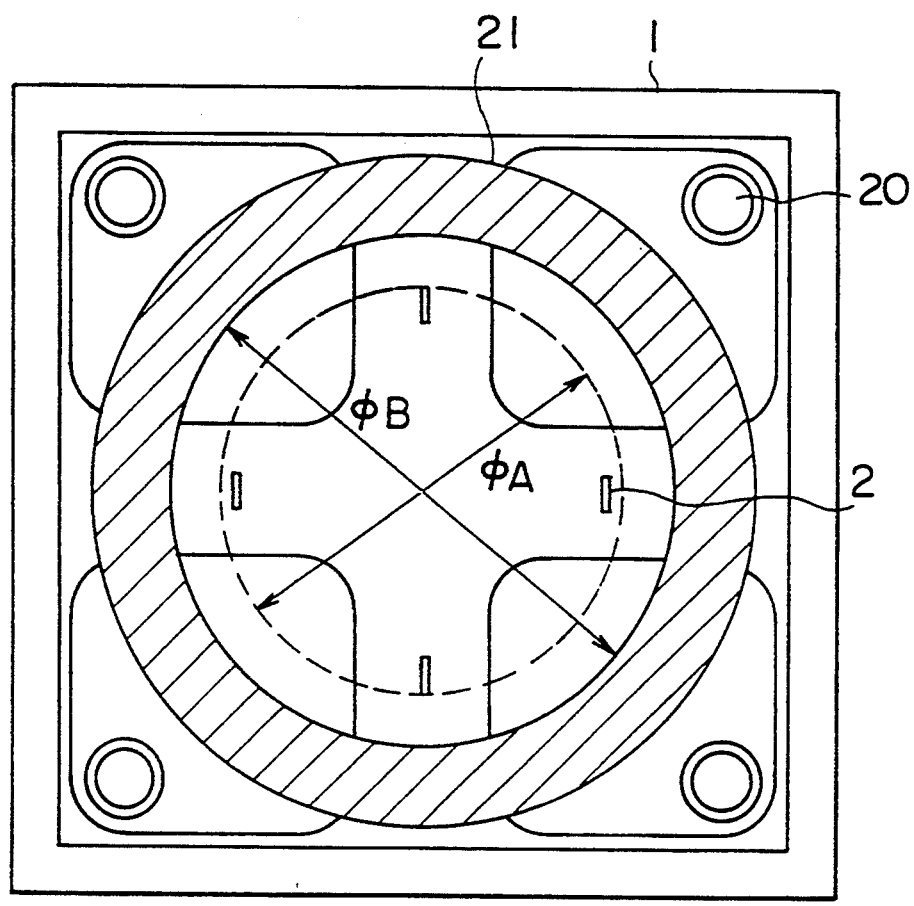
FIG. 1 is a top plan view which illustrates an essential portion of a semiconductor pressure sensor according to an embodiment of the present invention.

FIG. 1 is a top plan view which illustrates the essential portion of a semiconductor pressure sensor according to the first embodiment of the present invention. Like reference numerals indicate like or identical parts throughout the figures. In FIG. 1, a piezoresistor 2 and an electrode 20 are formed on the surface of a semiconductor pressure sensor chip 1. A dam 21 formed of a resin is provided in such a manner as to surround the outer periphery of the piezoresistor 2 in order to prevent a sheathing resin from flowing into a diaphragm portion during monolithic molding. A polyimide or silicon type resin having a low thermal expansion coefficient can be preferably used for the dam 21. The dam 21 can be formed by a printing method, photoengraving, etc. The internal diameter $\phi B$ of the dam 21 is set greater than the internal diameter $\phi A$ of a diaphragm which is formed on the semiconductor pressure sensor chip 1 by etching or the like.

Figure 2:
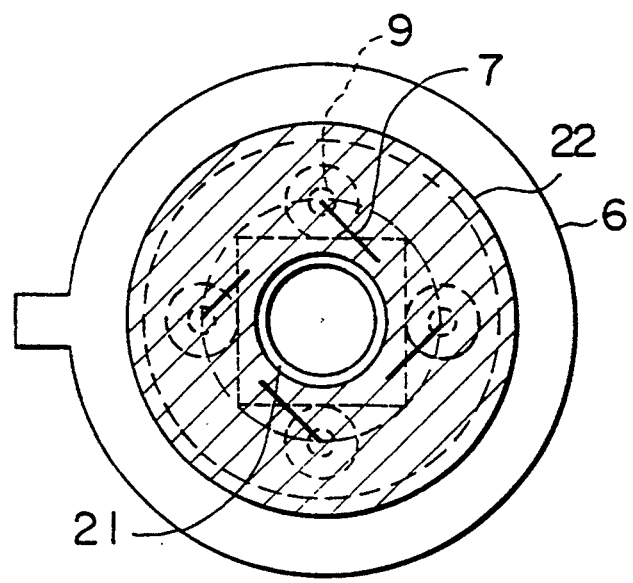
FIG. 2 is a top plan view which illustrates the semiconductor pressure sensor according to another embodiment of the present invention.
Figure 3:
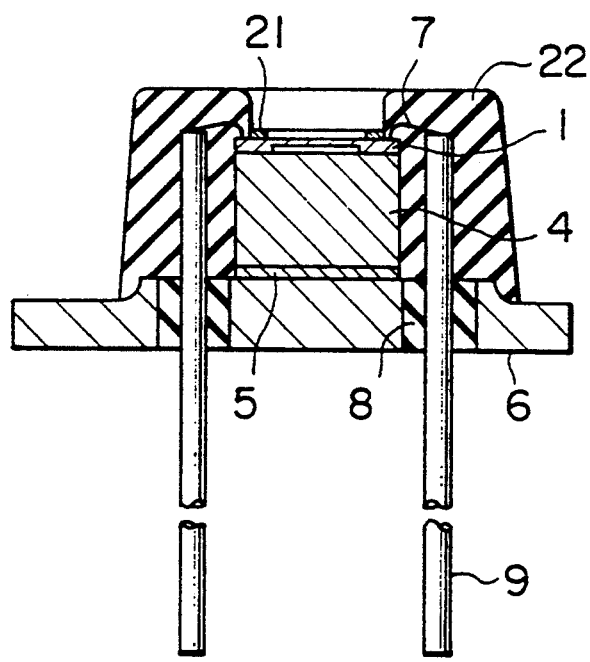
FIG. 3 is a longitudinal sectional view of the semiconductor pressure sensor shown in FIG. 2.

FIG. 2 is a top plan view which illustrates the semiconductor pressure sensor when it is monolithically molded by using a sheathing resin 22; and FIG. 3 is a longitudinal sectional view of the semiconductor pressure sensor. As shown in these figures, the sheathing resin 22 is molded in such a manner as to be adjacent to the outside of the dam 21. The electrode 20 is connected to a lead 9 for external connection through a lead 7 for internal connection, for example, a metallic wire, aluminum wire, or TAB lead.

Second Embodiment

Figure 4:
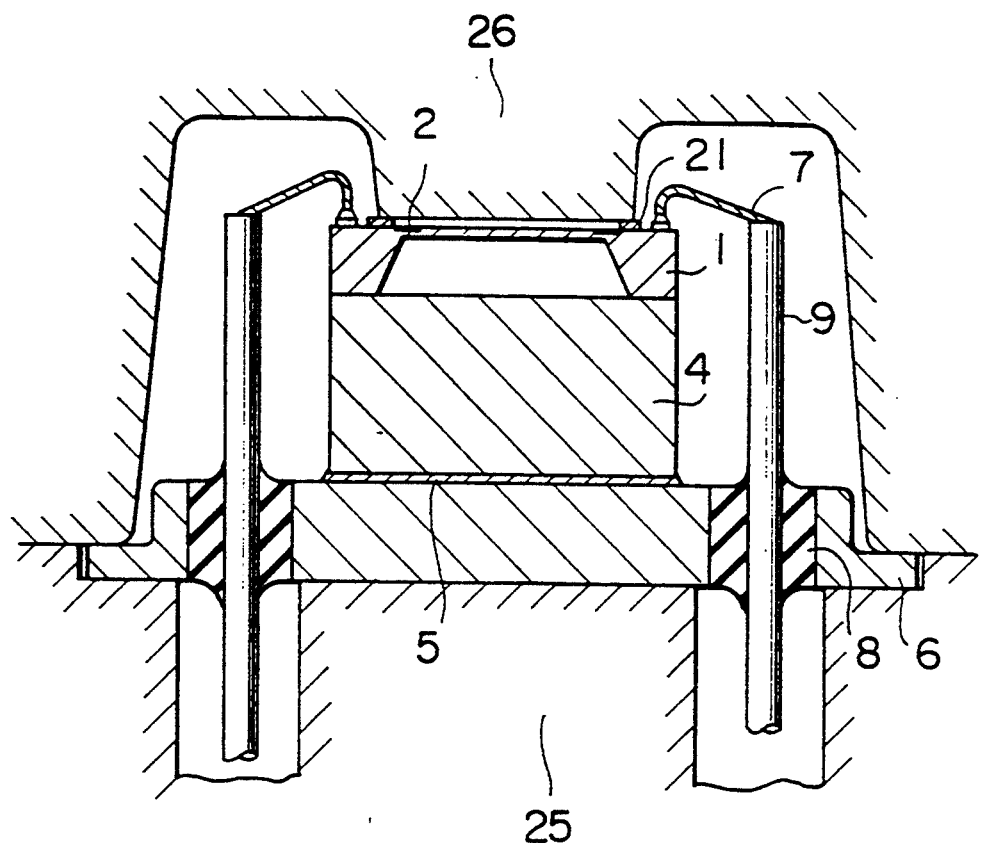
FIG. 4 is a longitudinal sectional view showing a state in which the semiconductor pressure sensor is mold-clamped according to the embodiment of the present invention.

FIG. 4 is a schematic sectional view which illustrates the construction of a mold die for use when a semiconductor pressure sensor is manufactured according to the second embodiment of the present invention. In this figure, the dam 21 is formed on the semiconductor pressure sensor chip 1 beforehand. Next, resin molding is performed while holding the semiconductor pressure sensor by a second die 26 and a first die 25 which are pressed and closely contacted via the dam 21 and preventing the sheathing resin 22 from flowing into the diaphragm portion.

Figure 5:
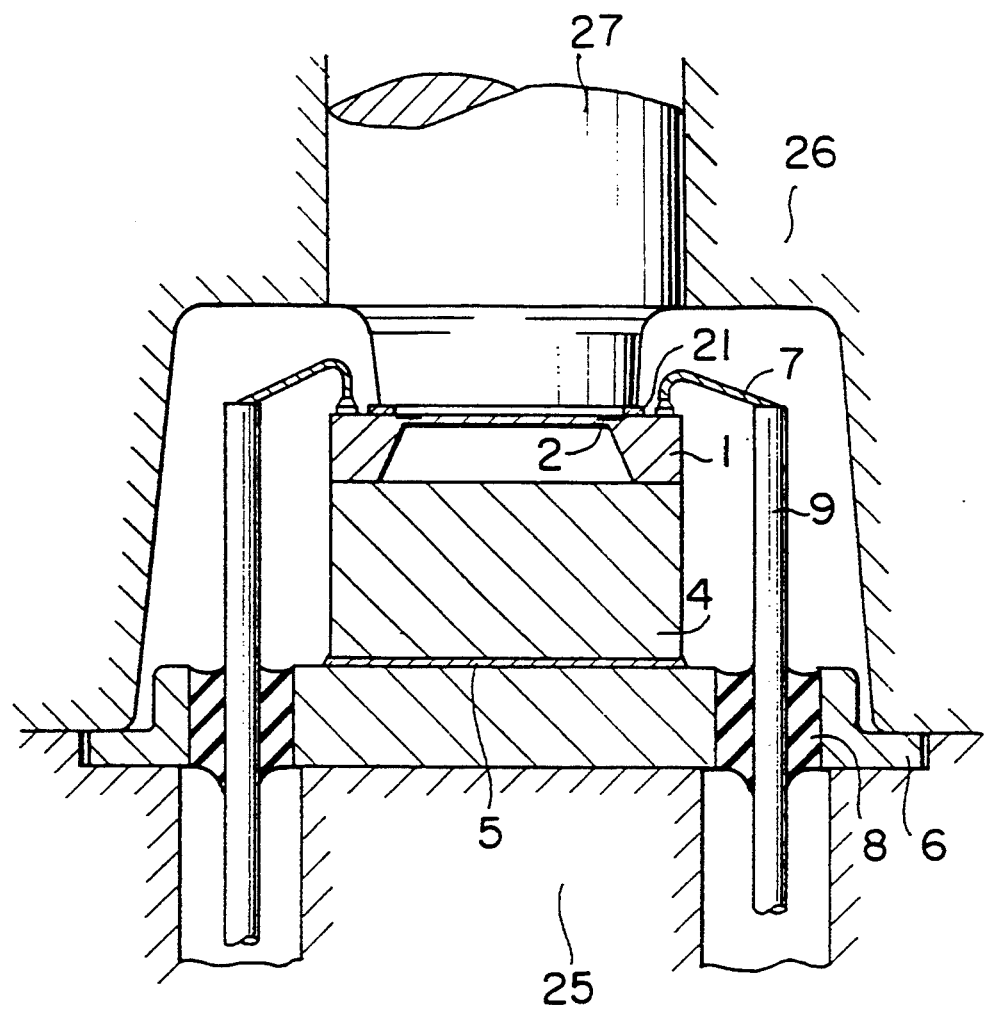
FIG. 5 is a longitudinal sectional view showing a state in which the semiconductor pressure sensor is mold-clamped according to another embodiment of the present invention.

FIG. 5 is a schematic sectional view illustrating the construction of a die similar to that in FIG. 4. The die comprises a third die 27 which is separate from the second die 26. That is, generally, a stem 6, a second die bonding material 5, a base 4, the semiconductor pressure sensor chip 1 and the dam 21, which constitute the semiconductor pressure sensor, are designed to have a design allowance. Therefore, a design allowance is adjusted by separating the third die 27 from the second die 26, with the result that the dam 21 can be pressed at a constant pressure.

Resin molding can be performed with a high degree of accuracy according to the manufacturing method described above. Also, resin molding can be performed with the volume of the sheathing resin 22 set at a predetermined value. Although a sprue, gate, and runner are not illustrated in FIGS. 4 and 5, a plurality of sprues, gates, and runners can be used because of the fact that the amount of resin to be injected is great and shapes and thicknesses change in many portions.

Third Embodiment

Next, an explanation will be given about a method of determining the sheathing dimensions of a sheathing resin according to the physical property values of a base, particularly the thermal expansion coefficient, volume and elastic coefficient of the base and of reducing strain which is caused in the diaphragm portion.

As is disclosed in the above-mentioned Japanese Patent Laid-Open No. 62-144368, the present invention does not pertain to reducing the influence exerted upon a diaphragm portion by a sheathing resin by merely decreasing the elastic coefficient of the sheathing resin, but pertains to the manufacture of semiconductor pressure sensors having a high degree of accuracy by providing functions of the physical properties described below which stipulate what dimensions the sheathing resin should be molded into in order to reduce the influence of strain and stress applied to the diaphragm portion when the functions of the physical properties of the base, the semiconductor pressure sensor chip, and the sheathing resin, for example, the elastic coefficient E and thermal expansion coefficient $\alpha$ of each of them, and particularly the dimensions of the semiconductor pressure sensor chip and the base, are determined in the design of characteristics.

First, a material having a linear expansion coefficient lower than that of a semiconductor pressure sensor chip is chosen for a base. A material having a linear expansion coefficient greater than that of the semiconductor pressure sensor chip is chosen for a sheathing resin. As a result, when the temperature returns to ordinary room temperature from a high temperature after the semiconductor pressure sensor is sheathed by a sheathing resin, compression strain is caused in the semiconductor pressure sensor chip from the sheathing resin and tension strain is caused in the semiconductor pressure sensor from the base, so that compression and tension strains balance with each other.

The volume of the base is denoted as $V_1$; the linear expansion coefficient thereof as $\alpha_1$; and the elastic coefficient thereof as $E_1$. The volume of the sheathing resin is denoted as $V_2$; the linear expansion coefficient thereof as $\alpha_2$; and the elastic coefficient thereof as $E_2$. The volume of the semiconductor pressure sensor chip is denoted as $V_0$; the linear expansion coefficient thereof as $\alpha_0$; and the elastic coefficient thereof as $E_0$. Then, a constraint strain of $\epsilon_1 = \Delta T (\alpha_1 - \alpha_0)$ is caused in the base due to a temperature difference $\Delta T$ with the semiconductor pressure sensor chip as a reference. A constraint strain of $\epsilon_2 = \Delta T (\alpha_2 - \alpha_0)$ is caused in the sheathing resin. A strain energy stored inside the base due to the above strain is $U_1 = \frac{1}{2} E_1 \epsilon_1^2 V_1$, and $U_2 = \frac{1}{2} E_2 \epsilon_2^2 V_2$ for the sheathing resin. It is theoretically possible that $U_1$ is set equal to $U_2$. At this time, although a compression strain is exerted upon the semiconductor pressure sensor chip from the sheathing resin, it is possible that because a tensile strain is exerted thereupon from the base and these strains are equal to each other, no strain is exerted equivalently. To be specific, the volume ratio of the volume $V_1$ of the base to the volume $V_2$ of the sheathing resin is theoretically determined in such a way that the equation $E_1 \epsilon_1^2 V_1 = E_2 \epsilon_2^2 V_2$ is satisfied. $V_2$ should be set equal to $E_1 \epsilon_1^2 V_1 / E_2 \epsilon_2^2$.

Let subscripts for the semiconductor pressure sensor chip, the base and the sheathing resin be 0, 1 and 2, respectively. The outer dimensions of the semiconductor pressure sensor chip are denoted by $x_0$, $y_0$ and $z_0$ and the shape thereof is assumed to be a cube. The outer dimensions of the base are denoted by $x_1$, $y_1$ and $z_1$ and the shape thereof is assumed to be a cube. The outer dimensions of the sheathing resin are denoted by $x_2$, $y_2$ and $z_2$ and the shape thereof is assumed to be a cube. Then, the volume $V_2$ of only the sheathing resin is expressed as $v_2 = x_2 y_2 z_2 - x_0 y_0 z_0 - x_1 y_1 z_1$, and the volume $V_1$ of the base is expressed as $V_1 = x_1 y_1 z_1$. Therefore, the outer dimensions of the sheathing resin should be selected so as to satisfy the relationship in equation (1) given below:

$$x_2 y_2 z_2 - (x_0 y_0 z_0 + x_1 y_1 z_1) = \frac{E_1 (\alpha_1 - \alpha_0)^2}{E_2 (\alpha_2 - \alpha_0)^2} \cdot x_1 y_1 z_1 \quad (1)$$

As a result, the whole of both of the semiconductor pressure sensor chip and the base should be covered with a sheathing resin with an amount given in equation (2) below:

$$x_2 y_2 z_2 = x_0 y_0 z_0 + \left( 1 + \frac{E_1 (\alpha_1 - \alpha_0)^2}{E_2 (\alpha_2 - \alpha_0)^2} \right) \cdot x_1 y_1 z_1 \quad (2)$$

If the base and the semiconductor pressure sensor chip each are assumed to be a cube, the entire semiconductor pressure sensor should be covered with a sheathing resin having a thickness t given in equation (3) below, and the value of t can be realized. Although the outer dimensions of the sheathing resin in the present invention is asymmetric because the sheathing resin is excluded in the diaphragm portion rather than the entire semiconductor pressure sensor being covered with the sheathing resin at a thickness of t, an optimum thickness can be determined from the thickness t:

$$t = \frac{\frac{E_1(\alpha_1 - \alpha_0)^2}{E_2(\alpha_2 - \alpha_0)^2} \cdot x_1 y_1 z_1}{2 \cdot (x_1 + y_1)(z_1 + z_0) + x_1 y_1} \quad (3)$$

The setting of strain energy as $E_1(\alpha_1-\alpha_0)^2 V_1 = E_2(\alpha_2-0)^2 V_2$ means that if $(\alpha_1-\alpha_0)<0$, the relation $(\alpha_2-\alpha_0)^2>0$ holds. The relationship between $V_1$ and $V_2$ which satisfies the equation can be found.

If the area of a portion of the semiconductor pressure sensor chip in contact with the base is denoted as $S_1$, a tensile force given by $(\alpha_1-\alpha_0) E_1 S_1 \Delta T$ is exerted upon the semiconductor pressure sensor chip. At the same time, if the area of a portion of the semiconductor pressure sensor chip in contact with the sheathing resin is denoted as $S_2$, a compressive force given by $(\alpha_2-\alpha_0) E_2 S_2 \Delta T$ is exerted upon the semiconductor pressure sensor chip. Since portions upon which the tensile force are exerted are primarily different from those of the compressive force, a shape must be devised such that the center of the compressive force and that of the tensile force agree, and the value of $(\alpha_1-\alpha_0) E_1 S^1 \Delta T + (\alpha_2-\alpha_0)^2 E_2 S_2$ can be made zero at four portions of the diaphragm where piezoresistors are disposed.

When design is made by the strain equation $E_1(\alpha_1-\alpha_0)^2 V_1 = E_2(\alpha_2-\alpha_0)^2 V_2$ described above, an error occurs in comparison to a case in which design is made by a partial force balance equation $(\alpha_1-\alpha_0)E_1 S_1 \Delta T + (\alpha_2-\alpha_0)E_2 S_2 \Delta T = 0$. However, the labor required for a design using a strain energy equation takes from approximately one thirtieth to one twentieth that for a design using a partial force balance equation. Therefore, the use of either the strain energy equation or the partial force balance equation should be chosen according to the accuracy of the semiconductor pressure sensor.

An example of physical property values of a material forming the semiconductor pressure sensor shown in FIG. 3 is: the semiconductor pressure sensor chip; $\alpha_0 = 0.35 \times 10^{-5}$ (1/° C.) and $E_0 = 1.92 \times 10^4$ kgf/mm²; if a pyrex glass is used for the base, $\alpha_1 = 0.32 \times 10^{-5}$ (1/° C.) and $E_1 = 0.69 \times 10^4$ kgf/mm²; if an epoxy resin is used for the sheathing resin, $\alpha_2 = 1.7 \times 10^{-5}$ (1/° C.) and $E_2 = 0.1140 \times 10^4$ kgf/mm². In addition, a quartz glass can be used for the base. In this case, $\alpha_1' = 0.055 \times 10^{-5}$ (1/° C.) and $E_1 = 0.72 \times 10^4$ kgf/mm².

Fourth Embodiment

Figure 6:
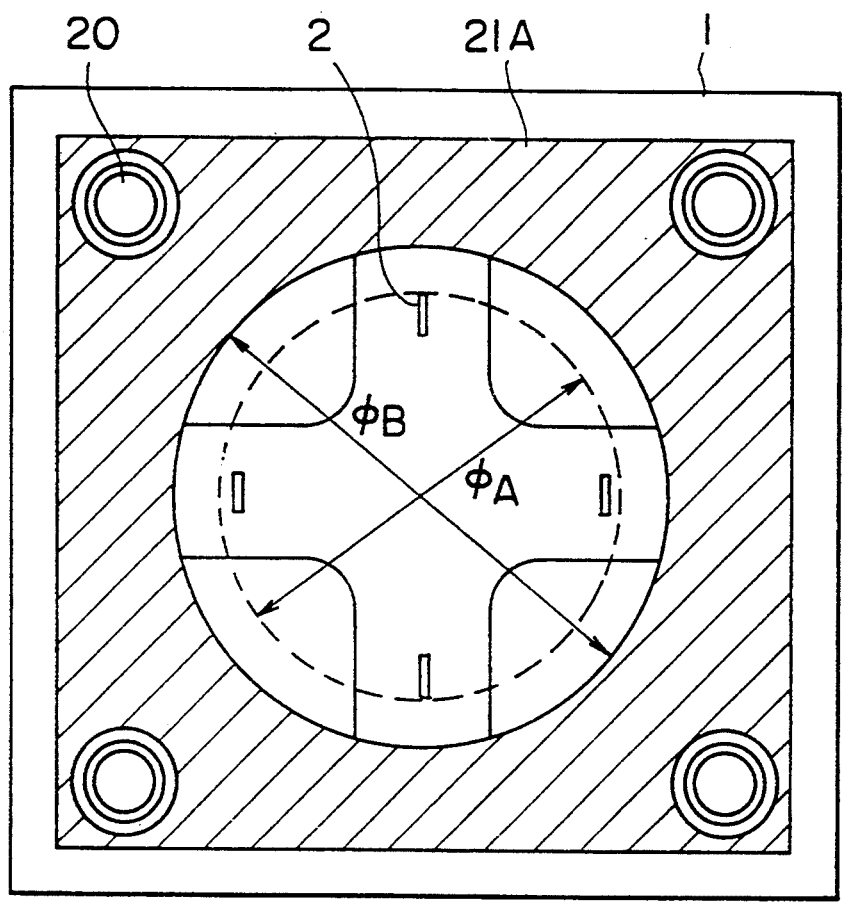
FIG. 6 is a top plan view which illustrates an essential portion of the semiconductor pressure sensor according to still another embodiment of the present invention.
Figure 7:
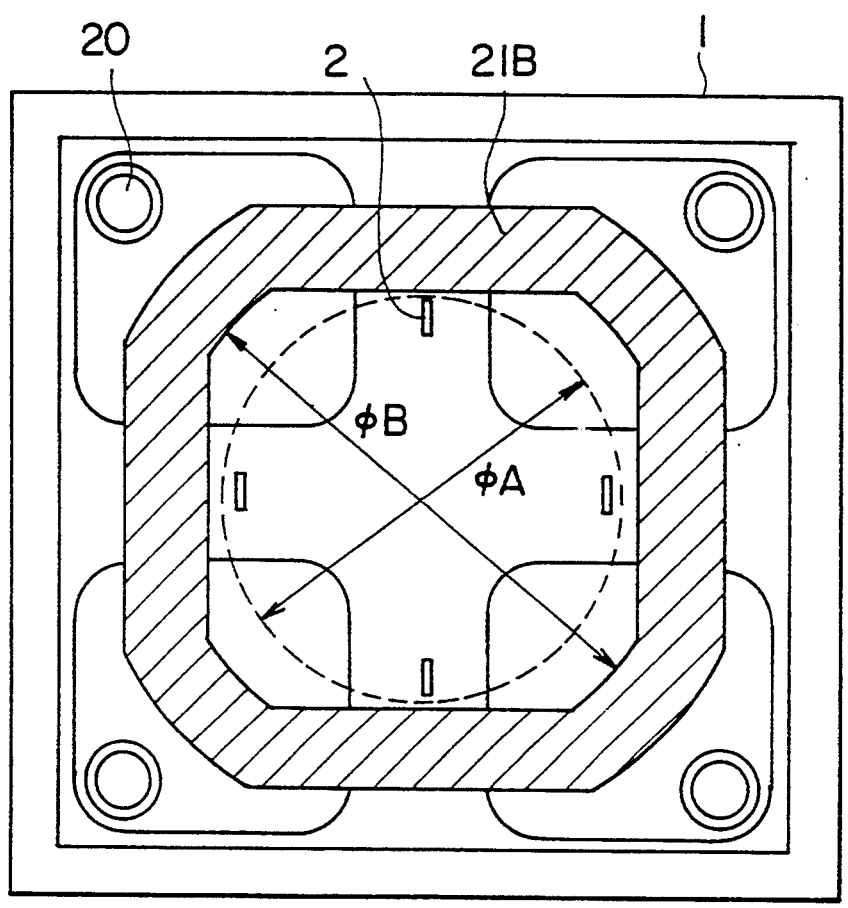
FIG. 7 is a top plan view which illustrates an essential portion of the semiconductor pressure sensor according to still another embodiment of the present invention.
Figure 8:
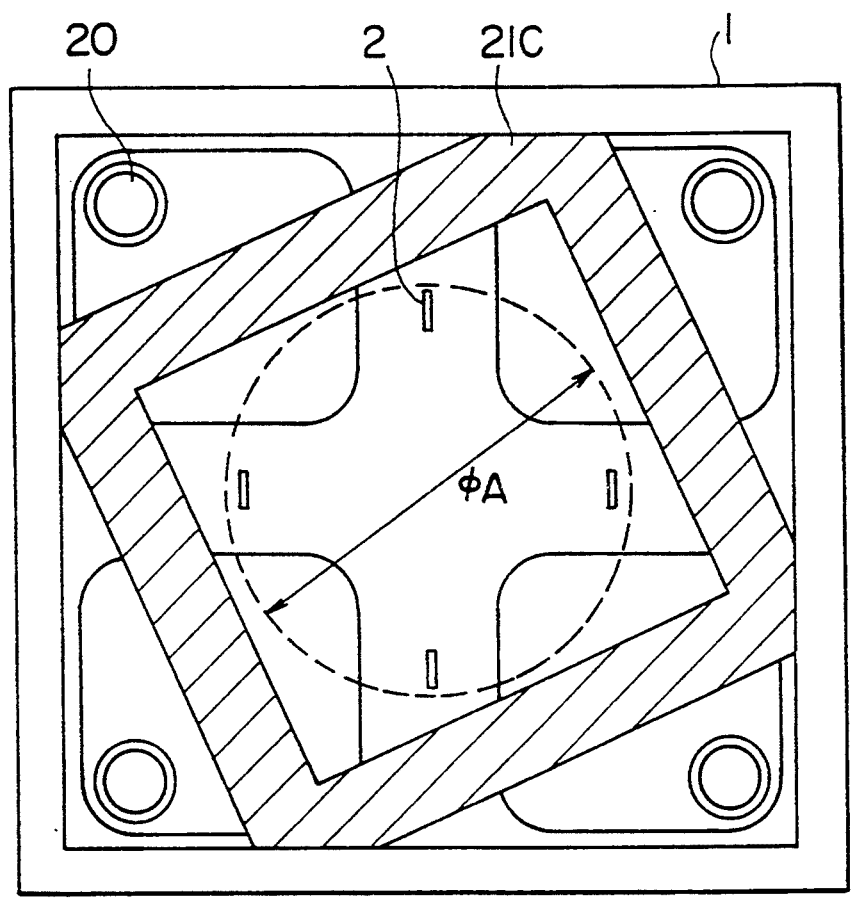
FIG. 8 is a top plan view which illustrates an essential portion of the semiconductor pressure sensor according to still another embodiment of the present invention.

Although in the above-described embodiment a dam in the shape of a circular donut is shown as numeral 21 in FIG. 1, a rectangular and a rectangular donut-shaped dam as shown in FIGS. 6, 7 and 8, and any other shape, may be used if the sheathing resin is constructed and shaped in such a way that it does not flow into the diaphragm portion and the electrode portion.

Fifth Embodiment

Figure 9:
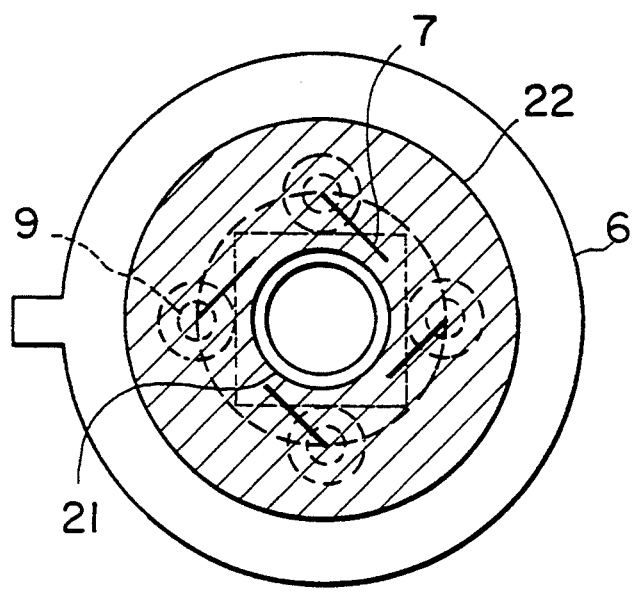
FIG. 9 is a top plan view which illustrates the semiconductor pressure sensor according to still another embodiment of the present invention.
Figure 10:
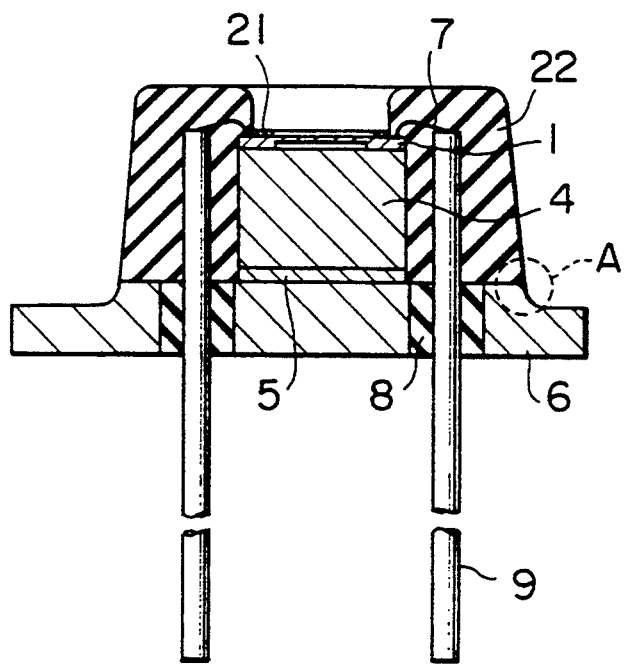
FIG. 10 is a longitudinal sectional view of the semiconductor pressure sensor shown in FIG. 9.
Figure 11:
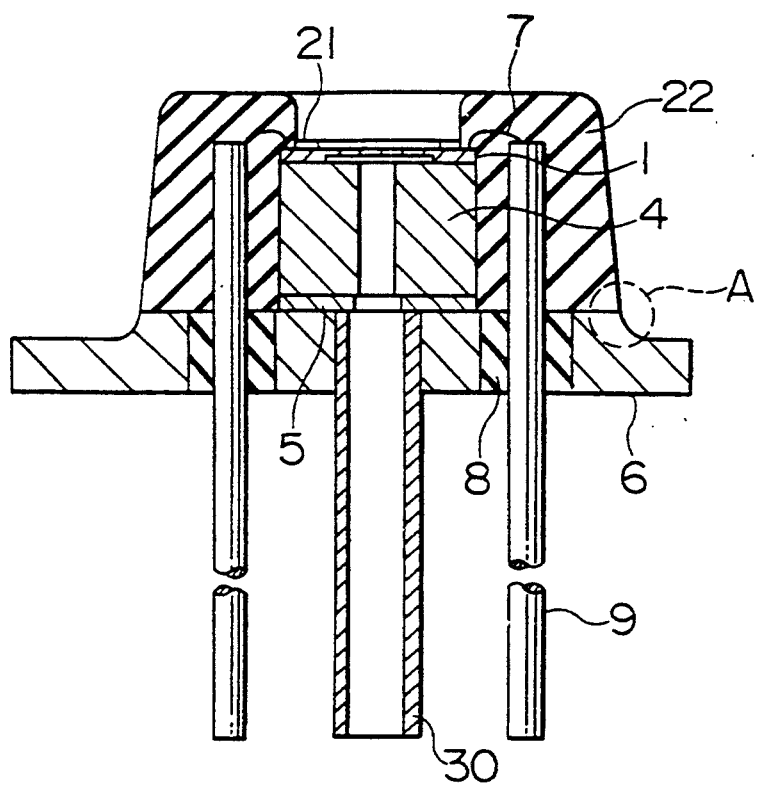
FIG. 11 is a top plan view which illustrates a rear-surface pressure receiving type semiconductor pressure sensor according to still another embodiment of the present invention.

The sheathing resin 22 may be molded on the top surface of the stem 6, as shown in FIGS. 9 and 10. Although an obverse-surface pressure receiving type semiconductor pressure sensor is shown in FIGS. 9 and 10, a rear-surface pressure receiving type semiconductor pressure sensor may also be used as shown in FIG. 11. In this case, even though a semiconductor pressure sensor having a pipe 30 provided on the rear surface thereof is shown in FIG. 11, this pipe 30 may be or may not be provided depending upon use purposes.

Figure 12:
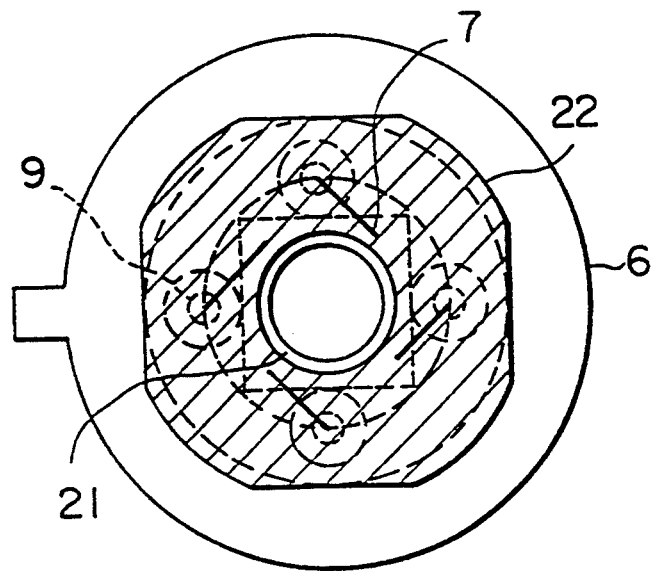
FIG. 12 is a top plan view which illustrates a semiconductor pressure sensor according to still another embodiment of the present invention.
Figure 13:
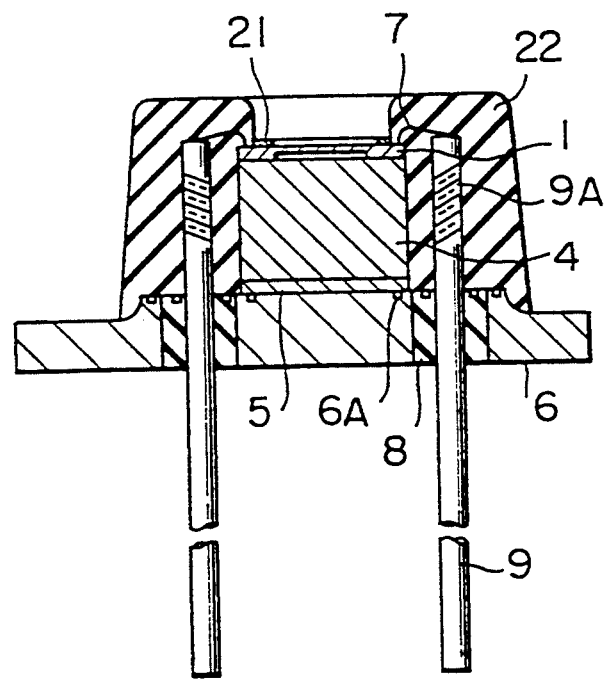
FIG. 13 is a sectional view of the semiconductor pressure sensor shown in FIG. 12.
Figure 14:
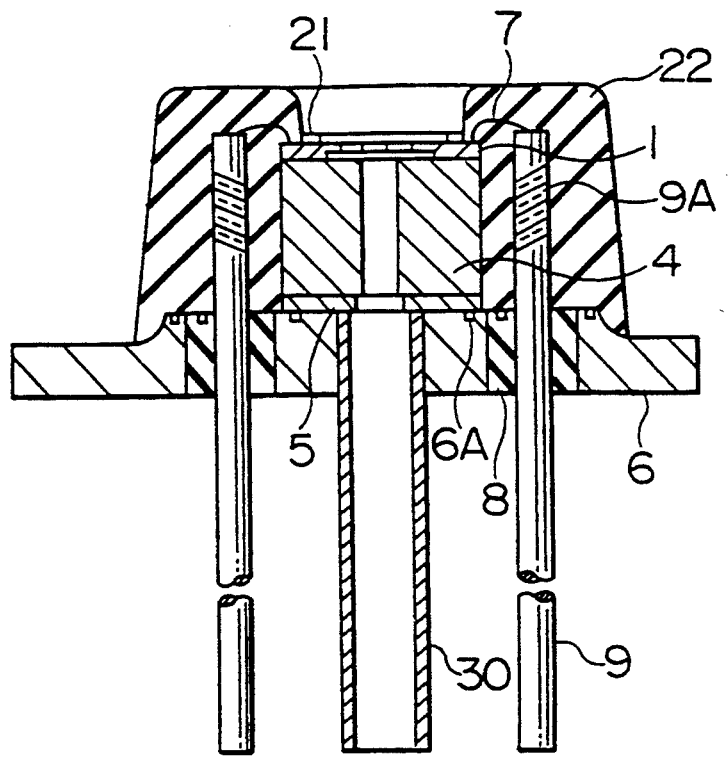
FIG. 14 is a sectional view which illustrates a rearsurface pressure receiving type semiconductor pressure sensor according to still another embodiment of the present invention.

In addition, as shown in FIGS. 12 and 13, the lead 9 for the external connection may be partially threaded 9A so that the strength of bonding with the sheathing resin 22 is increased, or a concentric groove 6A may be provided on the top surface of the stem 6 so that the strength of bonding between the sheathing resin 22 and the stem 6 is increased. The sheathing resin 22 is injected in a vacuum at a high temperature. When the sheathing resin 22 is cooled to ordinary room temperature, it contracts. As a consequence, since the sheathing resin 22 has a boundary surface with the stem 6, the lead 9 for external connection, the base 4 and the semiconductor pressure sensor chip 1, the sliding of the screw 9A and the groove 6A can be effectively prevented when design has been made under stringent dimensions in which sliding occurs in each of the boundary surfaces. Although an obverse-surface pressure receiving type semiconductor pressure sensor is shown in FIG. 13, a rear-surface pressure receiving type semiconductor pressure sensor may also be used as shown in FIG. 14. In this case, even though a rear-surface pressure receiving type semiconductor pressure sensor having a pipe 30 provided on the rear surface thereof is shown in FIG. 14, this pipe 30 may be or may not be provided depending upon use purposes.

Sixth Embodiment

Figure 15:
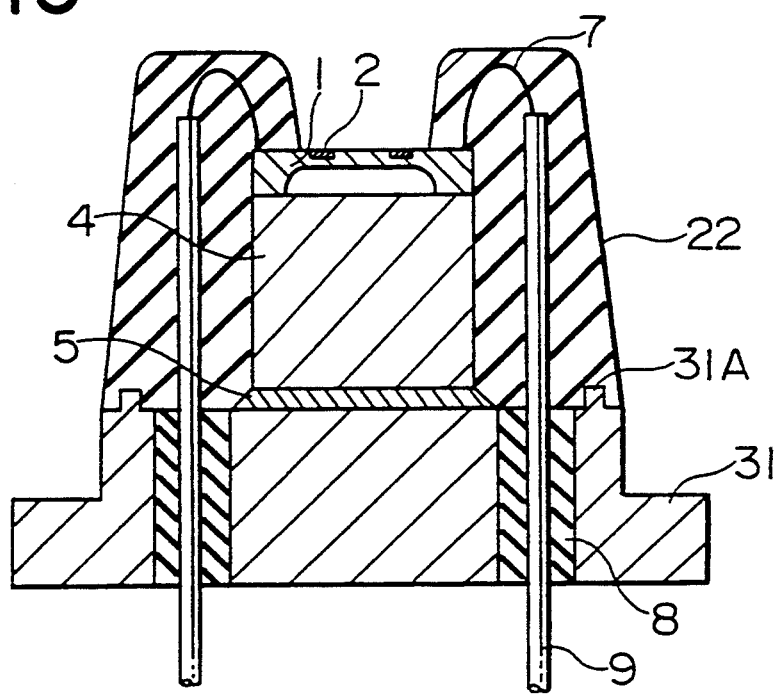
FIG. 15 is a sectional view which illustrates a semiconductor pressure sensor according to a sixth embodiment of the present invention.
Figure 16:
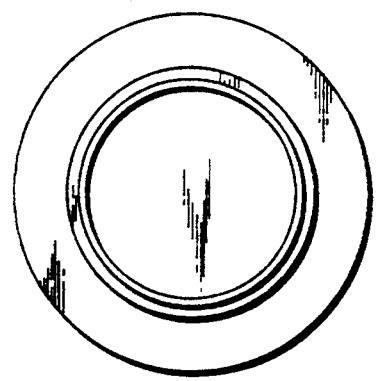
FIG. 16 is a top plan view which illustrates a stem of a semiconductor pressure sensor according to the sixth embodiment of the present invention.
Figure 17:
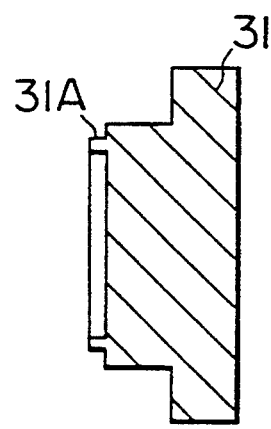
FIG. 17 is a sectional view which illustrates a stem of a semiconductor pressure sensor according to the sixth embodiment of the present invention.
Figure 41:
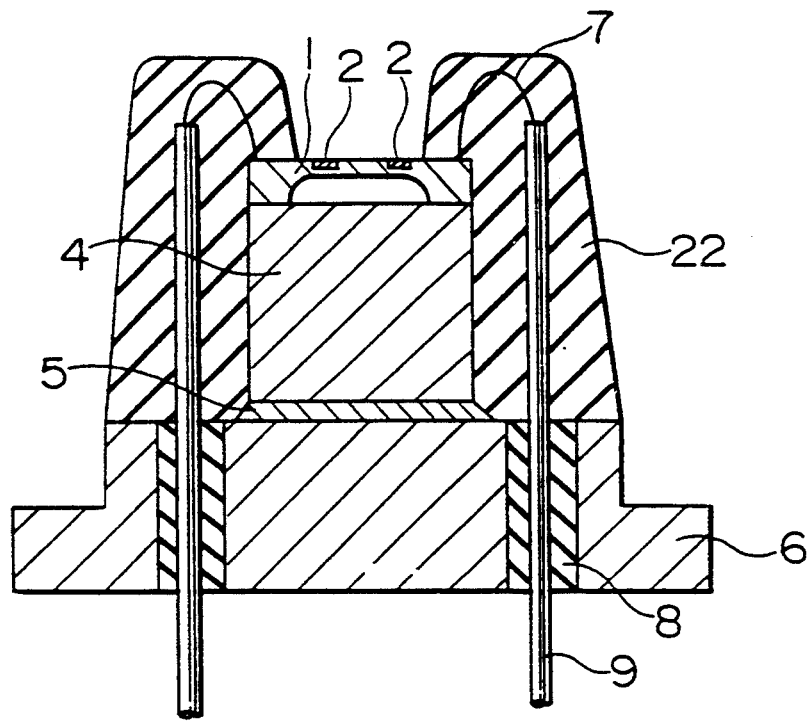
FIG. 41 is a sectional view which illustrates still another conventional semiconductor pressure sensor.

FIG. 15 is a sectional view which illustrates the construction of a semiconductor pressure sensor according to the sixth embodiment of the present invention. FIGS. 16 and 17 are respectively a top plan view and a sectional view, both of which illustrating a stem of a semiconductor pressure sensor according to the sixth embodiment of the present invention. In these figures, components which are the same as the conventional semiconductor pressure sensor shown in FIG. 41 are given the same reference numerals, and thus an explanation thereof is omitted. An annular projection 31A, which is a bonding-area enlarging means, is provided on the bonding area with the sheathing resin 22 in a stem 31 of the semiconductor pressure sensor. As a result, the area where the stem 31 is bonded with the sheathing resin 22 is enlarged by the projection 31A. The strength of the bonding of them increases in proportion to the area of the bonded area. Therefore, entry of water or the like can be prevented, increasing reliability.

Seventh Embodiment

Figure 18:
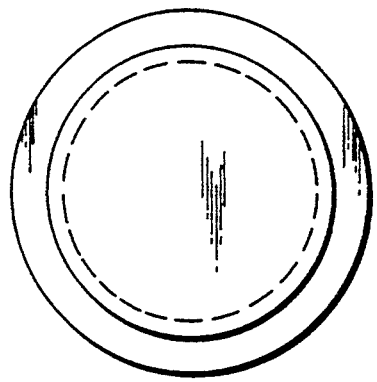
FIG. 18 is a top plan view which illustrates a stem of a semiconductor pressure sensor according to a seventh embodiment of the present invention.
Figure 19:
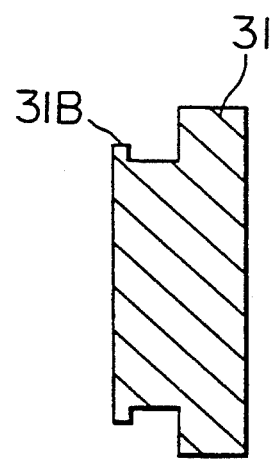
FIG. 19 is a sectional view which illustrates the stem of the semiconductor pressure sensor according to the seventh embodiment of the present invention.

FIGS. 18 and 19 are respectively a top plan view and a sectional view, both of which illustrating a stem of a semiconductor pressure sensor according to the seventh embodiment of the present invention. As shown in the illustrations, since a projection 31B is formed by protruding the top surface of the stem 31 sideways, the bonding area is enlarged by the projection 31B. In addition, if the sheathing resin 22 is provided around the side portion of the projection 31B so that the projection 31B is covered, the strength of the bonding of the stem 31 with the sheathing resin 22 increases more.

Eighth Embodiment

Figure 20:
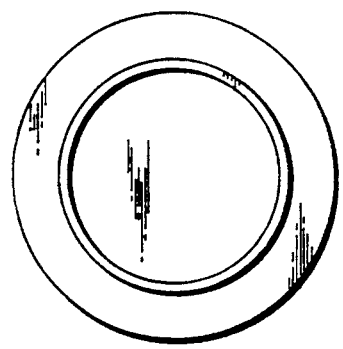
FIG. 20 is a top plan view which illustrates a stem of a semiconductor pressure sensor according to an eighth embodiment of the present invention.
Figure 21:
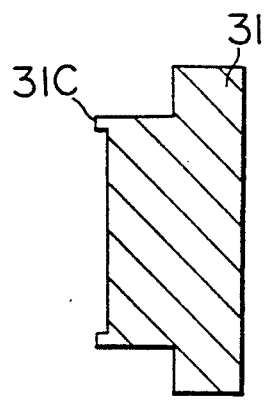
FIG. 21 is a sectional view which illustrates the stem of the semiconductor pressure sensor according to the eighth embodiment of the present invention.

FIGS. 20 and 21 are respectively a top plan view and a sectional view, both of which illustrating a stem of a semiconductor pressure sensor according to the eighth embodiment of the present invention. As shown in the illustrations, a projection 31C is formed in the extreme outer peripheral portion of the top surface of the stem 31 so that the area where the stem 31 is bonded with the sheathing resin 22 is enlarged.

Ninth Embodiment

Figure 22:
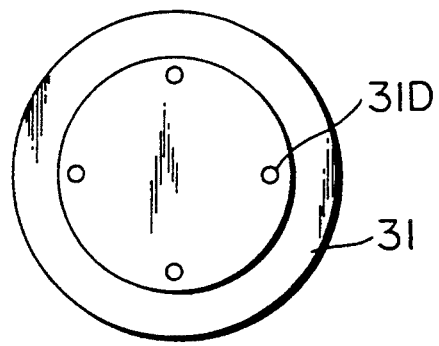
FIG. 22 is a top plan view which illustrates a stem of a semiconductor pressure sensor according to a ninth embodiment of the present invention.

FIG. 22 is a top plan view which illustrates a stem of a semiconductor pressure sensor according to the ninth embodiment of the present invention. A plurality of button-shaped projections 31D are formed on the top surface of the stem 31 so that the area where the stem 31 is bonded with the sheathing resin 22 is enlarged.

Tenth Embodiment

Figure 23:
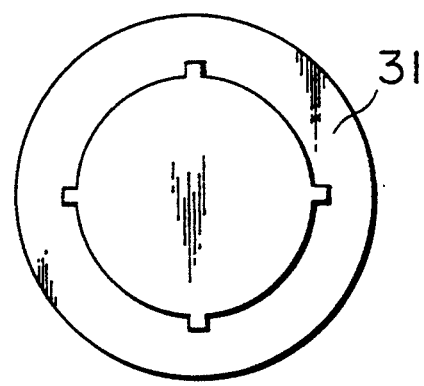
FIG. 23 is a top plan view which illustrates a stem of a semiconductor pressure sensor according to a tenth embodiment of the present invention.
Figure 24:
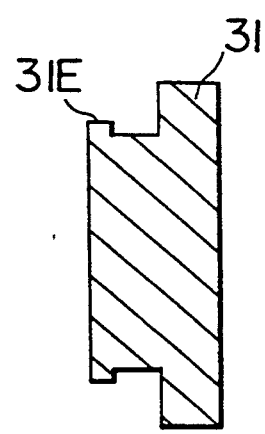
FIG. 24 is a sectional view which illustrates the stem of the semiconductor pressure sensor according to the tenth embodiment of the present invention.

FIGS. 23 and 24 are respectively a top plan view and a sectional view, both of which illustrating a stem of a semiconductor pressure sensor according to the tenth embodiment of the present invention. As shown in the illustrations, a plurality of projections 31E are formed on the upper side of the stem 31 so that the area where the stem 31 is bonded with the sheathing resin 22 is enlarged.

Eleventh Embodiment

Figure 25:
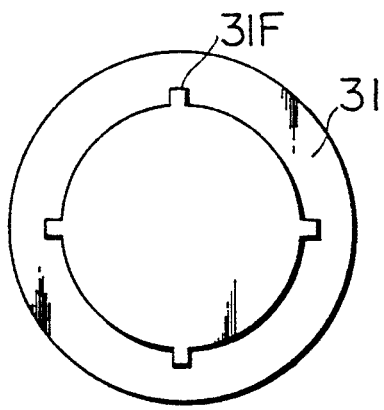
FIG. 25 is a top plan view which illustrates a stem of a semiconductor pressure sensor according to an eleventh embodiment of the present invention.
Figure 26:
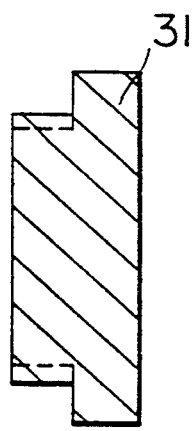
FIG. 26 is a sectional view which illustrates the stem of the semiconductor pressure sensor according to the eleventh embodiment of the present invention.

FIGS. 25 and 26 are respectively a top plan view and a sectional view, both of which illustrating a stem of a semiconductor pressure sensor according to the eleventh embodiment of the present invention. As shown in the illustrations, a plurality of projections 31F are formed outward from the side periphery of the stem 31 so that the area where the stem 31 is bonded with the sheathing resin 22 is enlarged.

Twelfth Embodiment

Figure 27:
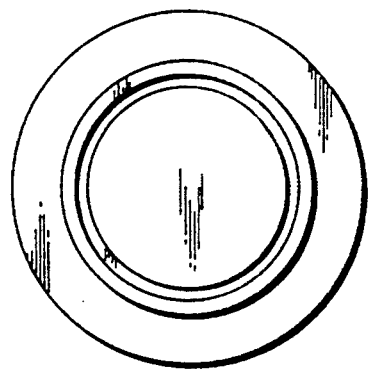
FIG. 27 Is a top plan view which illustrates a stem of a semiconductor pressure sensor according to a twelfth embodiment of the present invention.
Figure 28:
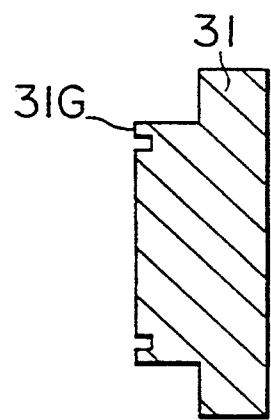
FIG. 28 is a sectional view which illustrates the stem of the semiconductor pressure sensor according to the twelfth embodiment of the present invention.

FIGS. 27 and 28 are respectively a top plan view and a sectional view, both of which illustrating a stem of a semiconductor pressure sensor according to the twelfth embodiment of the present invention. As shown in the illustrations, an annular recess 31G is formed on the top surface of the stem 31 so that the area where the stem 31 is bonded with the sheathing resin 22 is enlarged.

Thirteenth Embodiment

Figure 29:
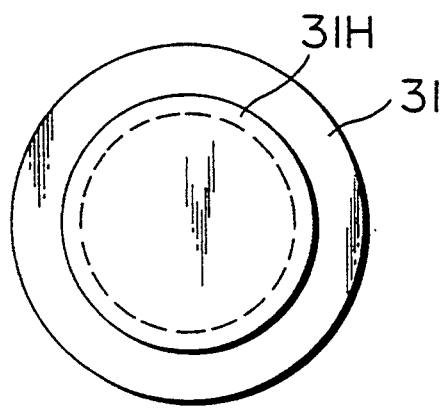
FIG. 29 is a top plan view which illustrates a stem of a semiconductor pressure sensor according to a thirteenth embodiment of the present invention.
Figure 30:
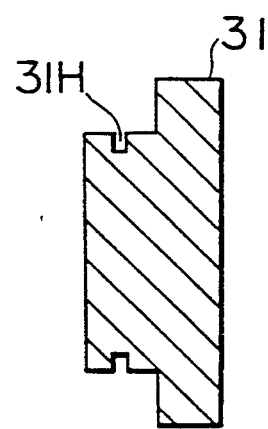
FIG. 30 is a sectional view which illustrates the stem of the semiconductor pressure sensor according to the thirteenth embodiment of the present invention.

FIGS. 29 and 30 are respectively a top plan view and a sectional view, both of which illustrating a stem of a semiconductor pressure sensor according to the thirteenth embodiment of the present invention. As shown in the illustrations, an annular recess 31H is formed throughout the entire periphery on the side of the stem 31 so that the area where the stem 31 is bonded with the sheathing resin 22 is enlarged.

Fourteenth Embodiment

Figure 31:
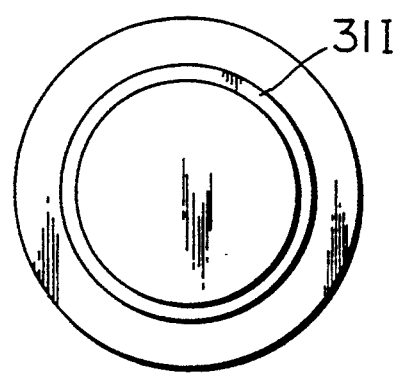
FIG. 31 is a top plan view which illustrates a stem of a semiconductor pressure sensor according to a fourteenth embodiment of the present invention.
Figure 32:
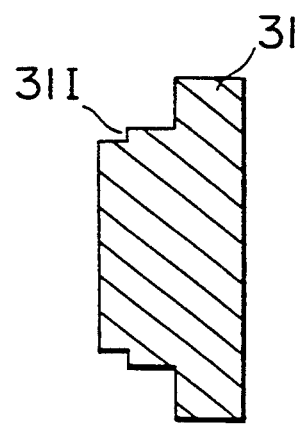
FIG. 32 is a sectional view which illustrates the stem of the semiconductor pressure sensor according to the fourteenth embodiment of the present invention.

FIGS. 31 and 32 are respectively a top plan view and a sectional view which illustrate a stem of a semiconductor pressure sensor according to the fourteenth embodiment of the present invention. As shown in the illustrations, a cutout recess 31I is formed throughout the entire periphery of the top surface of the stem 31 so that the area where the stem 31 is bonded with the sheathing resin 22 is enlarged.

Fifteenth Embodiment

Figure 33:
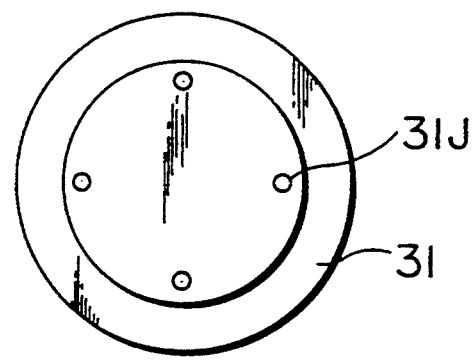
FIG. 33 is a top plan view which illustrates a stem of a semiconductor pressure sensor according to a fifteenth embodiment of the present invention.

FIG. 33 is a top plan view which illustrates a stem of a semiconductor pressure sensor according to the fifteenth embodiment of the present invention. As shown in the illustration, a plurality of round recesses 31J are formed on the top surface of the stem 31 so that the area where the stem 31 is bonded with the sheathing resin 22 is enlarged.

Sixteenth Embodiment

Figure 34:
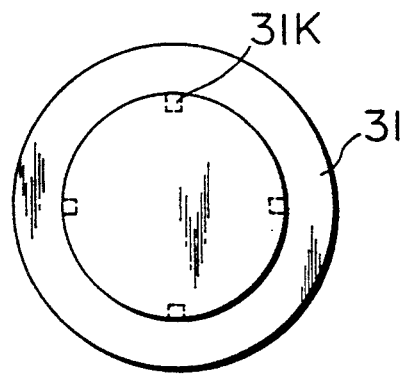
FIG. 34 is a top plan view which illustrates a stem of a semiconductor pressure sensor according to a sixteenth embodiment of the present invention.
Figure 35:
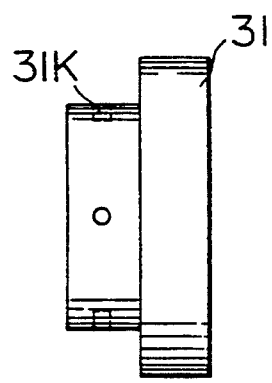
FIG. 35 is a sectional view which illustrates the stem of the semiconductor pressure sensor according to the sixteenth embodiment of the present invention.

FIGS. 34 and 35 are respectively a top plan view and a sectional view, both of which illustrating a stem of a semiconductor pressure sensor according to the sixteenth embodiment of the present invention. As shown in the illustrations, a plurality of round recesses 31K are formed on the side of the stem 31 so that the area where the stem 31 is bonded with the sheathing resin 22 is enlarged.

Seventeenth Embodiment

Figure 36:
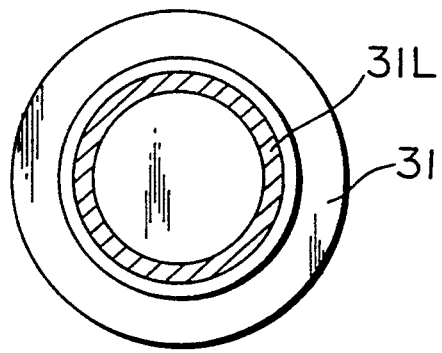
FIG. 36 is a top plan view which illustrates a stem of a semiconductor pressure sensor according to a seventeenth embodiment of the present invention.

FIG. 36 is a top plan view which illustrates a stem of a semiconductor pressure sensor according to the seventeenth embodiment of the present invention. As shown in the illustration, a toughened surface 31L having high surface roughness is formed on the top surface of the stem 31 so that the area where the stem 31 is bonded with the sheathing resin 22 is enlarged.

Eighteenth Embodiment

Figure 37:
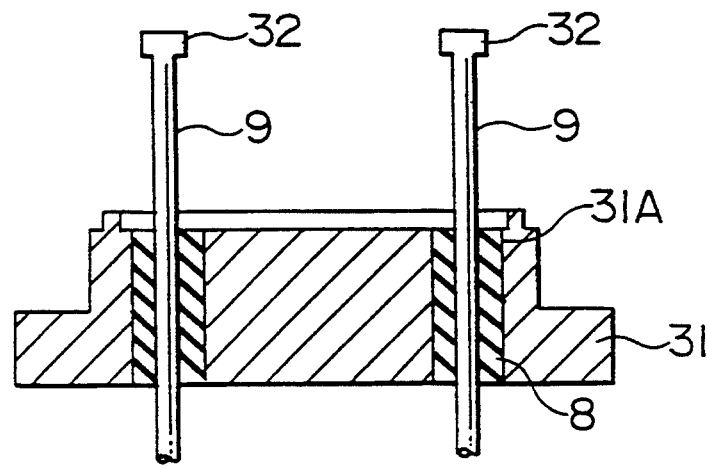
FIG. 37 is a sectional view which illustrates a stem of a semiconductor pressure sensor according to an eighteenth embodiment of the present invention.

Contrivance is made in the above-described sixth to seventeenth embodiments in such a way that bonding-area enlarging means for enlarging the area where the stem 31 is bonded with the sheathing resin 22 is formed on the top surface or side surface of each stem 31 so as to increase bonding strength. As shown in FIG. 37, if the annular projection 31A is formed on the top surface of the stem 31 so as to increase the bonded area and a large-diameter portion 32 is formed in the extreme end portion of the lead 9 as in the Sixth Embodiment, the bonding strength increases more.

Nineteenth Embodiment

Figure 38:
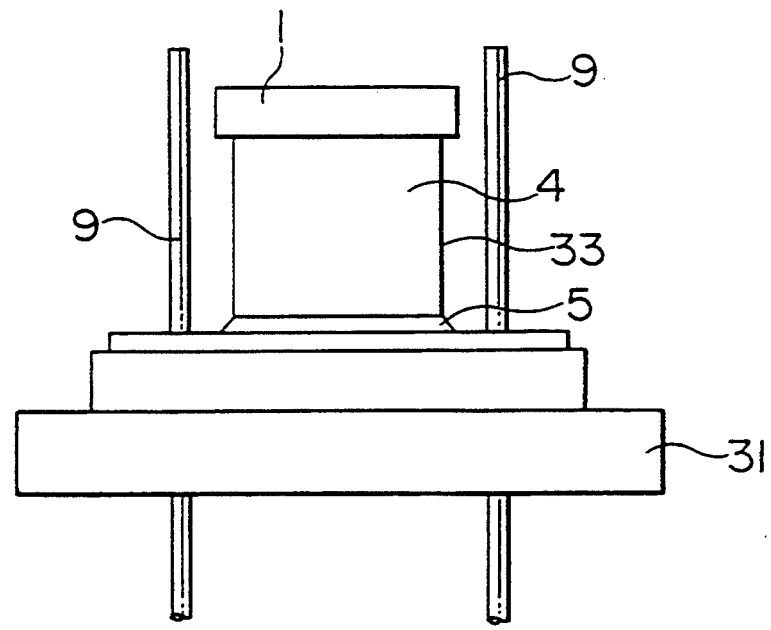
FIG. 38 is a sectional view which illustrates a stem of a semiconductor pressure sensor according to a nineteenth embodiment of the present invention.
Figure 39:
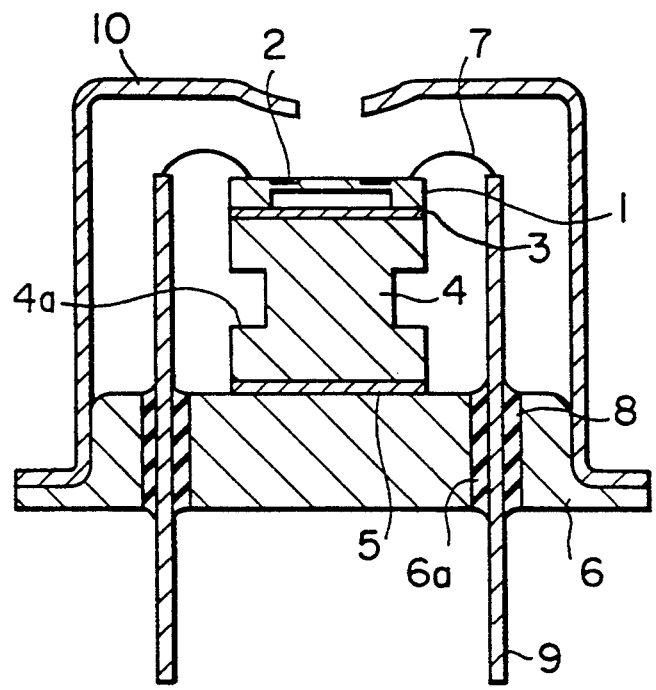
FIG. 39 is a longitudinal sectional view which illustrates a conventional semiconductor pressure sensor.
Figure 40:
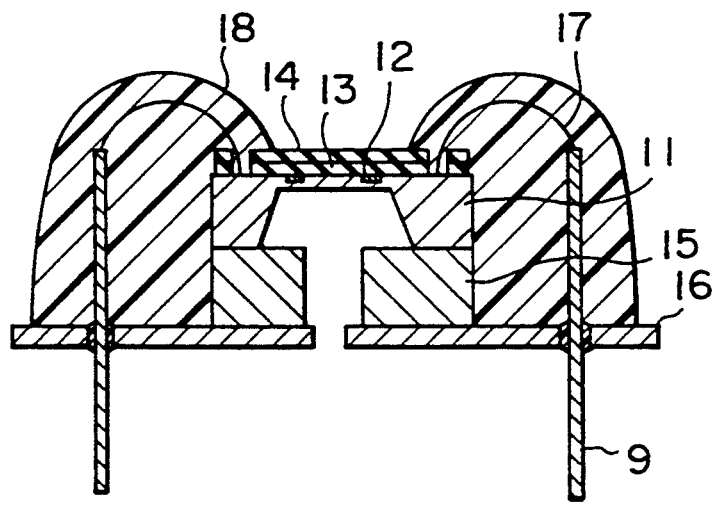
FIG. 40 is a sectional view which illustrates another conventional semiconductor pressure sensor.

If the annular projection 31A is formed on the top surface of the stem 31 as in the Eighteenth Embodiment so as to increase the area of the bonded surface, and if a small-diameter portion 33 is formed on the side of the base 4 as shown in FIG. 38, the bonding strength increases more as in the Eighteenth Embodiment.

Twentieth Embodiment

In addition, nickle plating is performed (not shown) on the top surface of the stem 31, and the base 4 is bonded thereto by a bonding material 5. Thereafter, the remainder of the exposed nickle-plated surface is oxidized to form a nickle oxide film. The nickle-oxidized film is coated with the sheathing resin 22. Thus, since there are many functional groups capable of forming hydrogen bonding which develops affinity on the bonded surface, the strength of the bonding of the stem 31 with the sheathing resin 22 increases.

What is claimed is:

1. A semiconductor pressure sensor comprising:
   a semiconductor pressure sensor chip having an obverse surface and a reverse surface;
   at least one piezoresistor formed on the obverse surface of the semiconductor pressure sensor chip;
   a diaphragm formed on the reverse surface of the semiconductor pressure sensor chip;
   a base on which the semiconductor pressure sensor chip is placed;
   a stem on which the base is placed;

a sheathing resin which covers an area near a side of the semiconductor pressure sensor chip and a side of the base, the sheathing resin being molded on the stem; and a dam formed on an outer periphery of the obverse surface of the semiconductor pressure sensor chip for preventing the sheathing resin from flowing into the diaphragm portion.

2. A semiconductor pressure sensor according to claim 1, wherein the dam is disposed, except in a wire bonding area, on the obverse surface of the semiconductor pressure sensor chip.

3. A semiconductor pressure sensor comprising:
a semiconductor pressure sensor chip having an obverse surface and reverse surface;
at least one piezoresistor formed on the obverse surface of the semiconductor pressure sensor chip;
a diaphragm formed on the reverse surface of the semiconductor pressure sensor chip;
a base on which the semiconductor pressure sensor chip is placed;
a stem on which the base is placed; and
a sheathing resin which covers an area near a side of the semiconductor pressure sensor chip and a side of the base and which is molded on the stem;
wherein the semiconductor pressure sensor chip, the base and the sheathing resin are each formed from material which satisfies $\alpha_{22} > \alpha_0 > \alpha_1$ when their thermal expansion coefficients are denoted as $\alpha_0$, $\alpha_1$ and $\alpha_2$, respectively, and a volume of the base and a volume of the semiconductor pressure sensor chip are adjusted so that a tensile force exerted upon the semiconductor pressure sensor chip from the base cancels a compressive force exerted upon the semiconductor pressure sensor chip by the sheathing resin when a temperature of the semiconductor pressure sensor returns to an ordinary room temperature from a higher temperature.

4. A semiconductor pressure sensor comprising:
a semiconductor pressure sensor chip having an obverse surface and a reverse surface;
at least one piezoresistor formed on the obverse surface of the semiconductor pressure sensor chip;
a diaphragm formed on the reverse surface of the semiconductor pressure sensor chip;
a base on which the semiconductor pressure sensor chip is placed;
a stem on which the base is placed;
a sheathing resin which is molded on the stem in such a manner as to cover a proximity of a side of the semiconductor pressure sensor chip and a side of the base;
a bonding-area enlarging means provided on an area where the stem is bonded with the sheathing resin; and
a dam formed on an outer periphery of the obverse surface of the semiconductor pressure sensor chip for preventing the sheathing resin from flowing into the diaphragm portion.

5. A sensor according to claim 4, wherein the bonding area enlarging means is a projection provided on the stem on the area where the stem is bonded with the sheathing resin.

6. A sensor according to claim 4, wherein the bonding area enlarging means is a projection formed by protruding a top surface of the stem sideways.

7. A sensor according to claim 4, wherein the bonding area enlarging means is a recess provided on a top surface of the stem.

8. A sensor according to claim 4, wherein the bonding area enlarging means is a recess provided on a side of the stem.

9. A sensor according to claim 4, wherein the bonding area enlarging means is a roughened surface provided on a top surface of the stem.

10. A sensor according to claim 4, further comprising leads formed through the stem and sheathing resin, the leads comprising a large-diameter portion formed in one extreme end portion of each lead.

11. A sensor according to claim 4, wherein a small-diameter portion is formed on a side of the base.

12. A semiconductor pressure sensor comprising:
a semiconductor pressure sensor chip having an obverse surface and a reverse surface;
at least one piezoresistor formed on the obverse surface of the semiconductor pressure sensor chip;
a diaphragm formed on the reverse surface of the semiconductor pressure sensor chip;
a base on which the semiconductor pressure sensor chip is placed;
a stem on which the base is placed;
a sheathing resin which is molded on the stem in such a manner as to cover a proximity of a side of the semiconductor pressure sensor chip and a side of the base; and
a bonding-area enlarging means provided on an area where the stem is bonded with the sheathing resin.

13. A sensor according to claim 12, wherein the bonding area enlarging means is a projection provided on the stem on the area where the stem is bonded with the sheathing resin.

14. A sensor according to claim 12, wherein the bonding area enlarging means ia projection formed by protruding a top surface of the stem sideways.

15. A sensor according to claim 12, wherein the bonding area enlarging means is a recess provided on a top surface of the stem.

16. A sensor according to claim 12, wherein the bonding area enlarging means is a recess provided on a side of the stem.

17. A sensor according to claim 12, wherein the bonding area enlarging means is a roughened surface provided on a top surface of the stem.

18. A sensor according to claim 12, further comprising leads formed through the stem and sheathing resin, the leads comprising a large-diameter portion formed in an extreme end portion of each lead.

19. A sensor according to claim 12, wherein a small-diameter portion is formed on a side of the base.

* * * * *